United States Patent [19]

Schade, Jr.

[11] 4,318,015
[45] Mar. 2, 1982

[54] LEVEL SHIFT CIRCUIT

[75] Inventor: Otto H. Schade, Jr., North Caldwell, N.J.

[73] Assignee: RCA Corporation, New York, N.Y.

[21] Appl. No.: 53,216

[22] Filed: Jun. 29, 1979

[51] Int. Cl.³ .................. H03K 19/003; H03K 5/02; H03K 3/356; H03K 19/094
[52] U.S. Cl. .................. 307/475; 307/446; 307/279
[58] Field of Search .......... 307/205, 264, 270, 279, 307/291, DIG. 1, 446, 475

[56] References Cited

U.S. PATENT DOCUMENTS

| | | | |
|---|---|---|---|
| 3,676,700 | 7/1972 | Buchanan | 307/279 X |
| 3,728,556 | 4/1973 | Arnell | 307/251 |
| 3,801,831 | 4/1974 | Dame | 307/251 |
| 3,829,710 | 8/1974 | Hirasawa et al. | 307/205 |
| 3,916,430 | 10/1975 | Heuner et al. | 307/DIG. 1 X |
| 3,942,043 | 3/1976 | Sirocka et al. | 307/279 |
| 4,023,050 | 5/1977 | Fox et al. | 307/DIG. 1 X |
| 4,039,862 | 8/1977 | Dingwall et al. | 307/DIG. 1 X |
| 4,080,539 | 3/1978 | Stewart | 307/270 X |
| 4,161,663 | 7/1979 | Martinez | 307/DIG. 1 |
| 4,169,233 | 9/1979 | Haraszti | 307/279 X |

FOREIGN PATENT DOCUMENTS 52-65635  5/1977  Japan .......................... 307/DIG. 1

Primary Examiner—Larry N. Anagnos
Attorney, Agent, or Firm—Samuel Cohen; Henry I. Schanzer

[57] ABSTRACT

Complementary signals which can assume either a first value or a second value are applied to the source electrodes of two transistors for turning one on and the other off. The drains of the two transistors are coupled via load means to a point to which is applied a potential having a third value, whereby when a transistor is turned-on, its drain is at, or close to, a potential of first value and when a transistor is turned-off its drain is at, or close to, the potential of third value.

9 Claims, 2 Drawing Figures

LEVEL SHIFT CIRCUIT

This invention relates to level shift circuits.

Level shift circuits are often employed to propagate signals between different parts of an electronic system which operate at different voltage levels. Such circuits should be compatible with the outer circuits of the system with respect, among other things, to speed of operation, and minimization of power dissipation.

In a level shift circuit embodying the invention, complementary signals which can assume either a first value of a second value are applied to one end of the conduction paths of two transistors whose control electrodes are so biased that one of the two transistors is turned-on while the other one is turned-off. The other end of the conduction paths of the two transistors are coupled via load means to a point of potential to which is applied a potential having a third value, whereby when a transistor is turned-on the other end of its conduction path is at, or close to, a potential of first value and when a transistor is turned-off the other end of its conduction path is at, or close to, the potential of third value.

Figure 1:
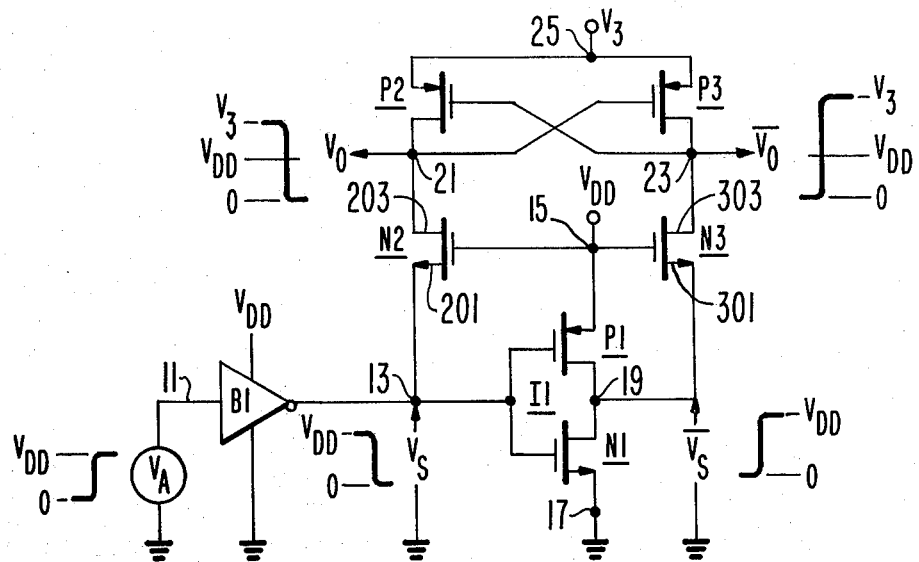
Figure 2:
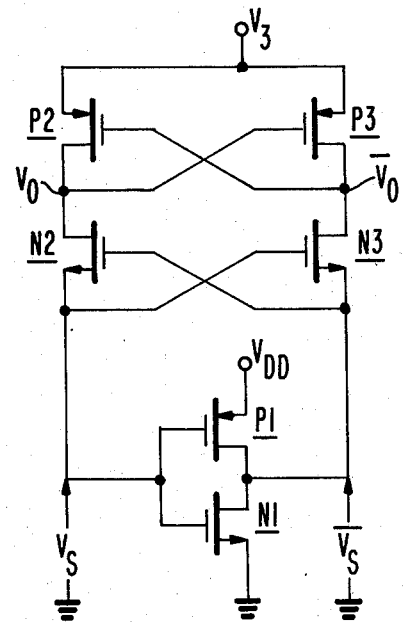

In the accompanying drawing like reference characteristics denote like components; and FIGS. 1 and 2 are schematic diagrams of level shift circuits embodying the invention.

Insulated-gate field-effect transistors (IGFETs) are the active devices preferred for use in practicing the invention. For this reason, the circuit is illustrated in the drawing as employing such transistors and will be so described hereinafter. However, this is not intended to preclude the use of other suitable devices and to this end, the term "transistor," when used without limitation in the appended claims, is used in a generic sense.

In the FIGURES, enhancement type IGFETs of P conductivity type are identified by the letter P followed by a particular reference character; and enhancement type IGFETs of N-conductivity type are identified by the letter N followed by a particular reference character. The characteristics of IGFETs are well known and need not be described in detail. But, for a clearer understanding of the description to follow, definitions and characteristics of IGFETs pertinent to the invention are set forth in column 2 of U.S. Pat. Nos. 4,037,114 and 4,001,606 and are incorporated herein by reference.

In the circuit of FIG. 1, a buffer B1 is connected at its input to an input terminal 11 and at its output to a terminal 13. $V_{DD}$ volts are applied to the positive power terminal of the buffer B1 and ground (zero volts) is applied to its negative power terminal. In response to signals, $V_A$, applied to its input the buffer B1 produces an output signal at terminal 13 which is either at, or close to, ground or which is at, or close to, $V_{DD}$ volts. Buffer B1 may be any one of a number of well know noninverting amplifiers or an inverter as shown symbolically in FIG. 1.

The level shift portion of the circuit of FIG. 1 includes a complementary inverter I1, two IGFETs (N2, N3) which are operated in the common gate mode, and two cross-coupled load transistors (P2, P3).

The complementary inverter I1 is comprised of two IGFETs, P1 and N1, having their gate electrodes connected in common to terminal 13, having their drain electrodes connected in common to terminal 19, and being connected at their source electrodes to power terminal 15 and 17, respectively.

Electrode 201 which defines one end of the conduction path of transistor N2 is connected to terminal 13 and electrode 301 which defines one end of the conduction path of transistor N3 is connected to terminal 19 whereby complementary signals are applied to electrodes 201 and 301. The gate electrodes of N2 and N3 are connected to terminal 15. Electrode 203 which defines the other end of the conduction path of N2 is connected to output terminal 21 and electrode 303 which defines the other end of the conduction path of N3 is connected to output terminal 23.

Normally, electrodes 201 and 301 function as the sources of their respective transistors and electrodes 203 and 303 function as the drains of their respective transistors. However, note that IGFETs can conduct bilaterally and that for an N-type IGFET, the source electrode is defined as the one electrode of the two electrodes defining the ends of its conduction path having the lower potential applied to it. (For a P-type IGFET the source electrode is defined as the one electrode of the two electrodes defining the ends of its conduction path having the higher potential applied to it.)

The source-to-drain path of transistor P2 is connected between terminals 21 and 25 and the source-to-drain path of transistor P3 is connected between terminals 23 and 25. The gate electrodes of P2 and P3 are connected to terminals 23 and 21, respectively. P2 and P3 function as active or switched loads for transistors N2 and N3, respectively.

In the discussion of the operation below, the following assumptions are made:

1. Ground or zero volts is applied to terminal 17;
2. $V_{DD}$ volts is applied to terminal 15, where $V_{DD}$ is more positive than zero volts and is, for example, equal to +5 volts;
3. $V_3$ volts is applied to terminal 25, where $V_3$ may have a wide range of values substantially greater than $V_{DD}$. For example, $V_3$ may range in value between 5 volts and 20 volts (the maximum value of $V_3$ is limited by the breakdown characteristics of N2, P2, N3 and P3); and
4. In the discussion to follow, a voltage at, or close to, $V_{DD}$ volts is arbitrarily defined as "high" or logic "1" and a voltage at, or close to, zero volts is arbitrarily defined as "low" or logic "0". Also, any voltage more positive than $V_{DD}$ volts will be defined as logic "1".

The operation of the circuit of FIG. 1 will first be examined for the condition of the potential ($V_S$) at terminal 13 equal to $V_{DD}$ volts, (high or logic "1"), then for the condition when $V_S$ makes a transition from $V_{DD}$ volts to zero volts, and then for $V_S$ equal to zero volts (low or logic "0").

When $V_S$ is at $V_{DD}$ volts, P1 is turned-off while N1 is turned-on and clamps terminal 19 at, or close to, zero volts, i.e. $\overline{V_S}$ is low. Transistor N2 with its source and its gate at $V_{DD}$ volts has a gate-to-source potential ($V_{GS}$) of zero volts and is turned-off. Transistor N3 with its gate at $V_{DD}$ volts and its source at, or close to, ground is turned-on hard. Since N3 is turned-on hard, the potential $\overline{V_0}$ at output terminal 23 to which the drain of N3 is connected is also at, or close to, ground. Hence, transistor P2 with $V_3$ volts applied to its source and zero volts applied to its gate is also turned-on hard and couples the $V_3$ volts at terminal 25 to output terminal 21 to which is connected the drain of transistor N2. Hence, the potential $V_0$ at terminal 21 is at, or close to, $V_3$ volts. Transistor P3 with its source and gate at, or close to, $V_3$ volts is turned-off. Although N3 is turned-on hard, P3 is cut-off. Hence, no current flows through P3 and the capacitance at terminal 23 is discharged to ground. Also, P2 is turned-on hard while N2 is cut-off. Hence, no current flows through N2 and the capacitance at terminal 21 is charged to $V_3$ volts. Thus, there is very little power dissipation except for the charging and discharging of the nodal capacitance (the flow of leakage currents is neglected).

The operation of the circuit when $V_S$ makes a transition from $V_{DD}$ volts to zero volts is now examined with emphasis on the role played by N3 in hastening the turn-off of P2 and the turn-on of N2 and P3. As $V_S$ goes from $V_{DD}$ volts to zero volts, P1 turns-on and N1 turns-off. P1-ON causes the potential at terminal 19 to go to $V_{DD}$ volts.

Recall that prior to $V_S$ going low (and $\overline{V_S}$ going high) N3 had been on and had discharged the nodal capacitance at terminal 23 to ground. Hence, electrode 303 of N3 is initially at ground potential while electrode 301 of N3 is going to, or is close to, $V_{DD}$ volts. Consequently, electrode 301 now functions as the drain and electrode 303 now functions as the source of N3. Since $V_{DD}$ volts are applied to the gate of N3, N3, which is being turned-off, conducts in the source follower mode charging terminal 23 towards $V_{DD}$ volts. (Actually, it can charge terminal 23 to $[V_{DD}-V_T]$ volts where $V_T$ is the threshold voltage of transistor N3. For ease of explanation, the threshold voltages of all the transistors are assumed to be the same and are also assumed to be zero in this discussion.) The rise in potential (V23) at terminal 23 decreases the conductivity of P2. Hence, transistor N2, which is being turned-on by $V_S$ going low, can discharge terminal 21 to ground more easily and quickly.

As terminal 21 is being discharged towards ground, transistor P3 is turned-on. The turn-on of P3 causes the potential ($\overline{V_0}$) at terminal 23 to rise to and above $V_{DD}$ volts. As soon as $\overline{V_0}$ equals $[V_{DD}-V_T]$ volts (and/or is more positive than $[V_{DD}-V_T]$ volts) N3 turns-off, with electrode 301 again functioning as its source and electrode 303 functioning as its drain.

It has, therefore, been shown that when N3 is first being turned-off ($\overline{V_S}$ is going high), it conducts in the source follower mode and provides an initial, transient, surge of current which charges the capacitance at terminal 23 towards its final steady state value. This enables high speed of operation and eases the constraints on the circuit design.

Normally, when N2 turns-on P2 is still turned-on hard. In the absence of the function performed by N3, for N2 to be able to lower the potential at terminal 21, its impedance would have to be much smaller than that of transistor P2. Hence, its size would have to be much greater than that of P2. There are then constraints on the ratio of N2 to P2 and since P2 must be above a minimum size to drive the load (not shown) connected to terminal 21, the level shift circuit requires a relatively large area. But, with N3 in the circuit, and with the transient conduction of N3 when first being turned-off, the conductivity of P2 is decreased and the ratio of N2 and P2 can be much smaller.

It should be evident that, when $V_S$ makes a transition from 0 volts to $V_{DD}$ volts, N2 functions in a similar manner to that described for N3. That is, when N2 is first being turned-off it conducts in the source follower mode tending to charge node 21 towards $V_{DD}$ thereby tending to turn-off P3 and aiding N3 in the faster discharge of terminal 23 to ground. The roles of N2 and N3 being similar the operation of N2 need not be further detailed.

When $V_S$ is low N1 is turned-off, P1 is turned-on and clamps terminal 19 to $V_{DD}$ volts. Thus, $\overline{V_S}$ is high. Transistor N2 with its gate at $V_{DD}$ volts and its source (201) at zero volts is turned-on hard. Transistor N3 with its gate and source (301) at $V_{DD}$ volts has a $V_{GS}$ of zero and is turned-off. With N2 conducting $V_0$ is pulled close to ground. Transistor P3 is then turned-on hard coupling $V_3$ to terminal 23, causing $\overline{V_0}$ to go to $V_3$ volts and turning-off P2. The switched load P2 is turned-off when N2 is turned-on and the switched load P3 is turned-on when N3 is turned-off. Hence, no low-impedance steady state conduction paths exists between $V_3$ and ground (or $V_{DD}$ and ground) and hence the circuit dissipates very little power while enabling large shifts in voltage levels between the input circuit (0-$V_{DD}$ volts) and the output circuits (0-$V_3$ volts).

The circuit of FIG. 1 may be modified as shown in FIG. 2. The circuit of FIG. 2 is similar to that of FIG. 1 except that the gates of transistors N2 and N3 are connected to terminals 13 and 19, respectively, rather than being returned to a fixed point of operating potential.

The significance of the connection shown in FIG. 2 is that when N2 or N3 is being turned-off its gate is being returned to zero volts while its source is being returned to $V_{DD}$ volts. Thus, the turn-off of a previously conducting transistor occurs at a different driving voltage ($V_S$ or $\overline{V_S}$) than in FIG. 1 since, assuming symmetrical operation, of $V_{GS}$ of zero is achieved at the mid point ($V_{DD}/2$) of the excursion between $V_{DD}$ and ground.

The circuit of FIG. 2 also enables a substantial reverse bias to be developed between the gate and source of transistors N2 and N3 when being turned-off. Thus, depletion mode transistors could be used and be driven into cut-off due to this reverse bias condition.

In the circuits of FIGS. 1 and 2 driving signals ($V_S$ and $\overline{V_S}$) varying between 0 and $V_{DD}$ volts are level shifted "up" to produce signals ($V_0$ and $\overline{V_0}$) varying between 0 and $V_3$ volts. It should be evident that these circuits could be modified to level shift down. Transistors N2, N3 would be replaced by transistors of P conductivity type, transistors P2 and P3 could be replaced by transistors of N conductivity type, the potential at terminal 15 could be made more negative than the potential at terminal 17, and the potential at terminal 23 could then be made more negative than the potential at terminal 25.

What is claimed is:

1. A level shift circuit comprising:
   first and second transistors, each transistor having source and drain electrodes defining the ends of a conduction path, and a control electrode;
   means for applying a driving signal having either a first value or a second value to the source electrode of said first transistor and to the control electrode of said second transistor, and means for applying the complement of said driving signal to the source electrode of said second transistor and to the control electrode of said first transistor for turning-on that one of said first and second transistors whose control electrode is at said second value and whose source electrode is at said first value and turning off that one of said first and second transistors whose control electrode is at said first value and whose source electrode is at said second value; and load means connected between the drain electrodes of each one of said first and second transistors and a power terminal to which is applied a voltage having a third value for producing a signal at the drain electrode of one of said first and second transistors which is approximately equal to said first value when that transistor is turned-on and which is approximately equal to said third value when that transistor is turned-off, where said second value is intermediate said first and third values.

2. In the level shift circuit claimed in claim 1 wherein said load means includes third and fourth cross-coupled transistors, each one of said cross-coupled transistors having a conduction path and a control electrode;

the conduction path of the third cross-coupled transistor being connected between the drain electrode of said first transistor and said power terminal and its control electrode being connected to the drain electrode of said second transistor; and the conduction path of the fourth cross-coupled transistor being connected between the drain electrode of said second transistor and said power terminal and its control electrode being connected to the drain electrode of said first transistor.

3. In the level shift circuit as claimed in claim 2 wherein said means for applying a driving signal to the source electrode of said first transistor and to the control electrode of said second transistor includes means direct current connecting via negligible impedance means the control electrode of said second transistor to the source electrode of said first transistor and wherein said means for applying the complement of said driving signal to the source electrode of said second transistor and to the control electrode of said first transistor includes means direct current connecting via negligible impedance means the control electrode of said first transistor to the source electrode of said second transistor.

4. In the level shift circuit claimed in claim 3 wherein said first and second transistors are of one conductivity type and wherein said third and fourth cross-coupled load transistors are of complementary conductivity type to said first and second transistors.

5. The combination comprising:

first, second and third power terminals for the application thereto of first, second and third different voltages, respectively, and where the second voltage is intermediate the first and third voltages;

an inverter having a signal input terminal adapted to receive signals having an amplitude approximately equal to either one of said first voltage or said second voltages, a signal output terminal at which is produced signals having a value approximately equal to said first or said second voltage, a first terminal connected to said first power terminal, and a second terminal connected to said second power terminal;

first and second transistors, each transistor having first and second electrodes defining the ends of a conduction path and a control electrode;

means connecting the first electrode of the first transistor and the control electrode of the second transistor to the signal input terminal of said inverter, and means connecting the first electrode of the second transistor and the control electrode of the first transistor to the signal output terminal of said inverter for turning-on said first transistor and turning-off said second transistor when the voltage at the inverter signal terminal input has said first value and for turning-off said first transistor and turning-on said second transistor when the voltage at the inverter signal input terminal has said second value; and load means connected between the second electrode of each one of said first and second transistors and said third power terminal.

6. The combination as claimed in claim 5 wherein said first and second transistors are insulated gate field-effect transistors (IGFETs), each IGFET having a source electrode corresponding to said first electrode, a drain electrode corresponding to said second electrode and a gate electrode corresponding to said control electrode.

7. The combination as claimed in claim 6 wherein said load means includes third and fourth IGFETs, each one of said third and fourth IGFETs having source and drain electrodes defining the ends of a conduction path and a gate electrode, the conduction paths of said third and fourth IGFETs being respectively connected between the drain electrode of said first and second transistors and said third power terminal; and wherein the gate of said third IGFET is connected to the drain of said fourth IGFET and the gate of said fourth IGFET is connected to the drain of said third IGFET.

8. The combination as claimed in claim 7 wherein said means connecting the first electrode of said first transistor and the control electrode of the second transistor to the signal input terminal includes means for direct current connecting via negligible impedance means the first electrode of the first transistor and the control electrode of the second transistor to said signal input terminal of said inverter; and wherein said means connecting the first electrode of the second transistor and the control electrode of the first transistor to the signal output terminal includes means for direct current connecting via negligible impedance means the first electrode of the second transistor and the control electrode of the first transistor to said signal output terminal of said inverter.

9. The combination as claimed in claim 8 wherein said first and second IGFETs are of one conductivity type and wherein said third and fourth IGFETs are of complementary conductivity type to said first and second transistors.

* * * * *